United States Patent
Lee

(10) Patent No.: US 9,165,671 B2
(45) Date of Patent: Oct. 20, 2015

(54) SEMICONDUCTOR MEMORY DEVICE AND METHOD OF OPERATING THE SAME

(71) Applicant: SK hynix Inc., Icheon-si, Gyeonggi-do (KR)

(72) Inventor: Un Sang Lee, Cheongju-si (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 14/457,568

(22) Filed: Aug. 12, 2014

(65) Prior Publication Data

US 2015/0270009 A1 Sep. 24, 2015

(30) Foreign Application Priority Data

Mar. 19, 2014 (KR) .................. 10-2014-0032173

(51) Int. Cl.
*G11C 16/34* (2006.01)
*G11C 16/10* (2006.01)
*G11C 16/04* (2006.01)

(52) U.S. Cl.
CPC ........ *G11C 16/3459* (2013.01); *G11C 16/0466* (2013.01); *G11C 16/10* (2013.01)

(58) Field of Classification Search
CPC ........... G11C 16/3454; G11C 16/3459; G11C 11/5628
USPC ........................ 365/185.22, 185.24
See application file for complete search history.

(56) References Cited

U.S. PATENT DOCUMENTS

| | | | |
|---|---|---|---|
| 6,721,204 B1* | 4/2004 | Yeh et al. ................. | 365/185.24 |
| 2007/0183208 A1* | 8/2007 | Tanaka et al. ............ | 365/185.22 |
| 2010/0085112 A1* | 4/2010 | Jeon et al. ..................... | 327/537 |
| 2013/0010541 A1* | 1/2013 | Futatsuyama et al. ... | 365/185.22 |

FOREIGN PATENT DOCUMENTS

| KR | 1020100056747 A | 5/2010 |
|---|---|---|
| KR | 1020120017279 A | 2/2012 |

* cited by examiner

*Primary Examiner* — Jason Lappas
(74) *Attorney, Agent, or Firm* — William Park & Associates Ltd.

(57) ABSTRACT

The semiconductor memory device includes a memory cell array including a plurality of memory cells, a peripheral circuit unit configured to perform a program voltage applying operation, a first verifying operation, and a detrap voltage applying operation with respect to the plurality of memory cells, and a control logic unit configured to issue at least one command to the peripheral circuit unit to determine whether to perform the detrap voltage applying operation based on a result of the first verifying operation performed following the performance of the program voltage applying operation.

19 Claims, 5 Drawing Sheets

SEMICONDUCTOR MEMORY DEVICE AND METHOD OF OPERATING THE SAME

CROSS-REFERENCE TO RELATED APPLICATION

The present application claims priority to Korean patent application number 10-2014-0032173 filed on Mar. 19, 2014, in the Korean Intellectual Property Office, the entire disclosure of which is incorporated by reference herein.

BACKGROUND

1. Technical Field

Various embodiments relate to an electronic device, and more specifically, to a semiconductor device and a method of operating the same.

2. Related Art

Semiconductor memory devices are memory devices implemented using a semiconductor materials, such as for example, silicon (Si), germanium (Ge), gallium arsenide (GaAs), indium phosphide (InP), or the like. Semiconductor memory devices are typically classified as volatile memory devices or as non-volatile memory devices.

A volatile memory device is a memory device where the data stored in the volatile memory device is lost when power to the memory device is cut off. Examples of volatile memory devices include a static random access memory (SRAM), a dynamic RAM (DRAM), a synchronous DRAM (SDRAM), and the like. A non-volatile memory device is a memory device in which the data stored in the non-volatile memory device is retained maintained when the power to the memory device is cut off. Examples of non-volatile memory devices include a read-only memory (ROM), a programmable ROM (PROM), an erasable programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), or the like. A flash memory is typically classified as a NOR type or a NAND type memory device.

A flash memory may also be classified as either a two-dimensional semiconductor device where a string is horizontally formed on a semiconductor substrate or a three-dimensional semiconductor device where the string is vertically formed on the semiconductor substrate.

A three-dimensional semiconductor device is a memory device is typically used to overcome limitations of a degree of integration in the two-dimensional semiconductor device, and includes a plurality of strings vertically formed on the semiconductor substrate. Each of the plurality of strings includes a drain select transistor, memory cells, and a source select transistorserially connected between a bit line and a source line.

SUMMARY

An embodiment of a semiconductor memory device, includes a memory cell array including a plurality of memory cells, a peripheral circuit unit configured to perform a program voltage applying operation, a first verifying operation, and a detrap voltage applying operation with respect to the plurality of memory cells, and a control logic unit configured to control the peripheral circuit unit to determine whether to perform the detrap voltage applying operation based on a result of the first verifying operation performed following the performance of the program voltage applying operation.

An embodiment of a semiconductor memory device, includes a memory cell array including a plurality of memory cells, a peripheral circuit unit configured to perform a program voltage applying operation, a first verifying operation using a first verifying voltage, a second verifying operation using a second verifying voltage, and a detrap voltage applying operation with respect to the plurality of memory cells, and a control logic unit configured to control the peripheral circuit unit to perform the program voltage applying operation, the first and second verifying operations, and the detrap voltage applying operation, and control the peripheral circuit unit to sequentially perform the detrap voltage applying operation and the second verifying operation when the first verifying operation passes.

An embodiment of a method of operating a semiconductor memory device, includes applying a program voltage to selected memory cells selected from among a plurality of memory cells, performing a first verifying operation using a first verifying voltage having a relatively higher voltage level than a target threshold voltage; applying a detrap voltage to the selected memory cells if the first verifying operation passes, and performing a second verifying operation using a second verifying voltage having a relatively lower voltage level than the first verifying voltage.

DETAILED DESCRIPTION

Throughout the specification, it will be understood that when an element is referred to as being "connected" or "coupled" to another element, it can be directly connected or coupled to the other element or intervening elements may be present. Further, it will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Figure 1:
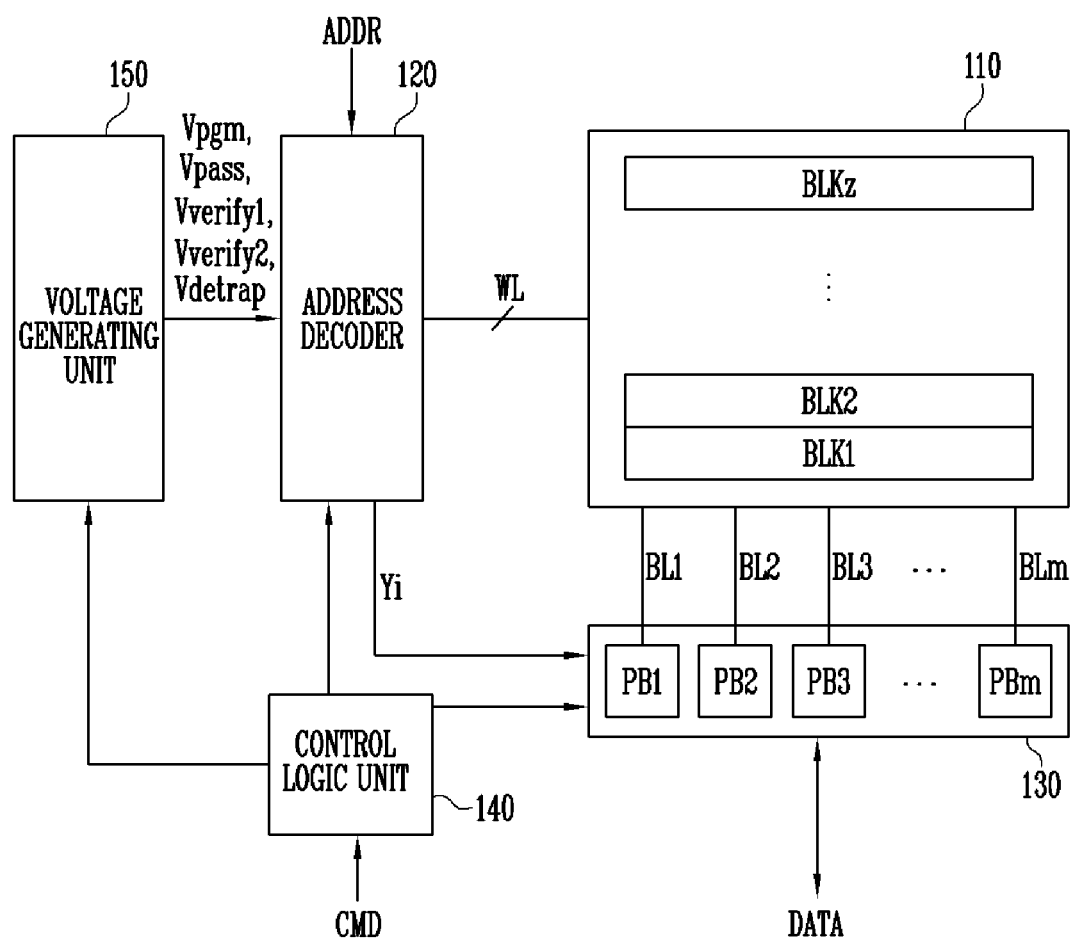
FIG. 1 is a block diagram representation of an embodiment of a semiconductor memory device.

FIG. 1 is a block diagram representation of an embodiment of a semiconductor memory device 100.

The semiconductor memory device 100 may include a memory cell array 110, an address decoder 120, a read/write circuit 130, a control logic unit 140, and a voltage generation unit 150.

The memory cell array 110 may include a plurality of memory blocks BLK1-BLKz. The plurality of memory blocks BLK1-BLKz may be electrically coupled to the address decoder 120 through word lines WL. The plurality of memory blocks BLK1-BLKz may be electrically coupled to the read/write circuit 130 through bit lines BL1-BLm. Each of the plurality of memory blocks BLK1-BLKz may include a plurality of memory cells. In an embodiment, the plurality of memory cells may be non-volatile memory cells. In an embodiment, the plurality of memory cells may be charge trap device-based non-volatile memory cells. The memory cells electrically coupled to the same word line may be referred to as a page. The memory cell array 110 may be configured as a plurality of pages. Each of the plurality of memory blocks BLK1-BLKz in the memory cell array 110 may include a plurality of strings. Each of the plurality of strings may include a drain select transistor, a plurality of drain-side memory cells, a pipe transistor, a plurality of source-side memory cells, and a source select transistor serially electrically coupled between a bit line and a source line.

The address decoder 120, the read/write circuit 130, and the voltage generation unit 150 may operate as a peripheral circuit unit for driving the memory cell array 110.

The address decoder 120 may be electrically coupled to the memory cell array 110 through word lines WL. The address decoder 120 may be configured to operate under the control of the control logic unit 140. The address decoder 120 may receive an address ADDR through an input/output buffer (not shown) included in the semiconductor memory device 100.

During a program voltage applying operation, the address decoder 120 may apply a program voltage Vpgm and a pass voltage Vpass generated by the voltage generation unit 150 to a plurality of word lines WL of the memory cell array 110. The selection of the plurality of word lines WL of the memory cell array 110 are based on a decoded row address generated by decoding a row address included in a received address ADDR. During a program verifying operation, the address decoder 120 may apply a first verifying voltage Vverify1 and a second verifying voltage Vverify2 generated by the voltage generation unit 150 to a selected word line. The selected word line is selected from among the plurality of word lines WL based on the decoded row address. During a detrap voltage applying operation, the address decoder 120 may apply a detrap voltage Vdetrap generated by the voltage generation unit 150 to the selected word line.

The address ADDR received by the address decoder 120 may include a column address. The address decoder 120 may be configured to decode the column address during a read operation. The address decoder 120 may transmit the decoded column address Yi to the read/write circuit 130.

A program operation of the semiconductor memory device 100 may be performed in units of pages. When a program operation is requested, the received address ADDR may include a block address, the row address, and the column address. The address decoder 120 may select the memory block and the word line associated with the block address and the row address. The column address may be decoded by the address decoder 120, and the decoded column address may be provided to the read/write circuit 130.

The address decoder 120 may include a block decoder, a row decoder, a column decoder, and an address buffer.

The read/write circuit 130 may include a plurality of page buffers PB1-PBm. The plurality of page buffers PB1-PBm may be electrically coupled to the memory cell array 110 through the bit lines BL1-BLm. During the program operation, each of the plurality of page buffers PB1-PBm may temporarily store input data DATA, and adjust the potentials of the corresponding bit lines BL1-BLm in accordance with the temporarily stored data. During the program verifying operation, the plurality of page buffers PB1-PBm may sense the potentials of the bit lines BL1-BLm of the memory cell array 110, and compare the sensed potentials with the potentials of the temporarily stored data. During the program verifying operation, each of the plurality of page buffers PB1-PBm may precharge the potentials of the bit lines BL1-BLm prior to sensing the potentials of the bit lines BL1-BLm.

The read/write circuit 130 may operate under the control of the control logic unit 140.

In an embodiment, the read/write circuit 130 may include page buffers (or page registers), and a column select circuit.

The control logic unit 140 may be electrically coupled to the address decoder 120, the read/write circuit 130, and the voltage generation unit 150. The control logic unit 140 may receive a command CMD through an input/output buffer (not shown) of the semiconductor memory device 100. The control logic unit 140 may be configured to control one or more operations of the semiconductor memory device 100 in response to the command CMD. The control logic unit 140 may determine whether to perform the detrap voltage applying operation or to perform the program voltage applying operation again by increasing the program voltage based on a result of a first verifying operation. The control logic unit 140 may issue one or more commands to the peripheral circuit unit to either end the program operation or perform the detrap voltage applying operation again following the application of an increased program voltage to the selected word line based on a result of a second verifying operation. The second verifying operation is performed following the performance of the detrap voltage applying operation.

The voltage generation unit 150 may generate the program voltage Vpgm, the pass voltage Vpass, the first and second verifying voltages Vverify1, Vverify2, and the detrap voltage Vdetrap under the control of the control logic unit 140. The first verifying voltage Vverify1 may have a relatively higher voltage level than a target threshold voltage for programming the memory cell. The second verifying voltage Vverify2 may have substantially the same voltage level as the target threshold voltage. The first verifying voltage Vverify1 may have a relatively voltage higher level than the second verifying voltage Vverify2.

Figure 2:
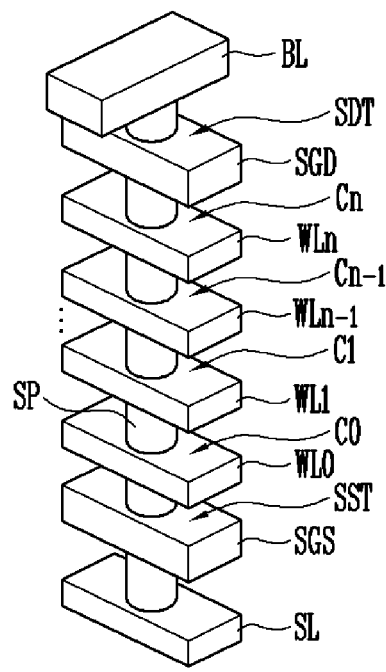
FIG. 2 is diagramatic representation of an embodiment of a three-dimensional structure of a memory string of an embodiment of a memory block.
Figure 3:
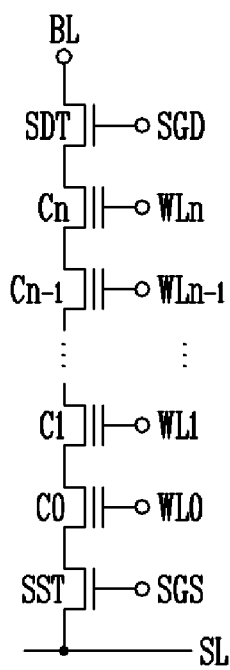
FIG. 3 is a circuit diagram representation of an example of the memory string shown in FIG. 2.

FIG. 2 is diagramatic representation of a three-dimensional structure of a memory string included in an embodiment of a memory block. FIG. 3 is a circuit diagram representation of an example of the memory string shown in FIG. 2.

Referring to FIGS. 2 and 3, a common source line SL may be formed on the semiconductor substrate. A vertical channel layer SP may be formed on the common source line SL. An upper portion of the vertical channel layer SP may be electrically coupled to a bit line BL. The vertical channel layer SP may be formed of polysilicon. A plurality of conductive films SGS, WL0-WLn, and SGD may be formed at different positions of the vertical channel layer SP. A multilayer film (not shown) including a charge storing film may be formed on a surface of the vertical channel layer SP. The multilayer film may be positioned between the vertical channel layer SP and the conductive films SGSL, WL0-WLn, and SGD. The multilayer film may have an ONO structure where an oxide film, a nitride film, and an oxide film are sequentially stacked.

The lowermost conductive film may be a source select line (or a first select line) SGS, and the uppermost conductive film may be a drain select line (or a second select line) SGD. The conductive films between the select lines SGS-SGD may be the word lines WL0-WLn. The conductive films SGS, WL0-WLn, and SGD may be formed in a multilayer configuration on the semiconductor substrate. The vertical channel layer SP extending through the conductive films SGS, WL0-WLn, and SGD and may vertically extend between and electrically couple the bit line BL and the source line SL.

The drain select transistor (or a second select transistor) SDT may be formed at a position at which the uppermost conductive film SGD covers the vertical channel layer SP. The source select transistor (or a first select transistor) SST may be formed at a position at which the lowermost conductive film SGS covers the vertical channel layer SP. The memory cells may be formed at the positions where the intermediate conductive films WL0-WLn cover the vertical channel layer SP.

In the above-described structure, the memory string may include the source select transistor SST, the memory cells C0-Cn, and the drain select transistor SDT. The source select transistor SST, the memory cells C0-Cn, and the drain select transistor SDT are configured in a general perpendicular configuration and are electrically coupled between the common source line SL and the bit line BL. The source select transistor SST may electrically couple the memory cells C0-Cn and the common source line SL in response to a first select signal applied to the first select line SGS. The drain select transistor SDT may electrically couple the memory cells C0-Cn and the bit line BL in response to a second select signal applied to the second select line SGD.

In the above-described memory cells C0-Cn, upon the repeated performance of the program/erase operation, a trap layer may be formed in the oxide film of the multilayer film used as a tunnel insulating film, and electrons may be trapped. Since the electrons trapped in the tunnel insulating film move following the completion of the program operation a threshold voltage is relatively lower and the retention characteristics of the memory cells may deteriorate.

Figure 4:
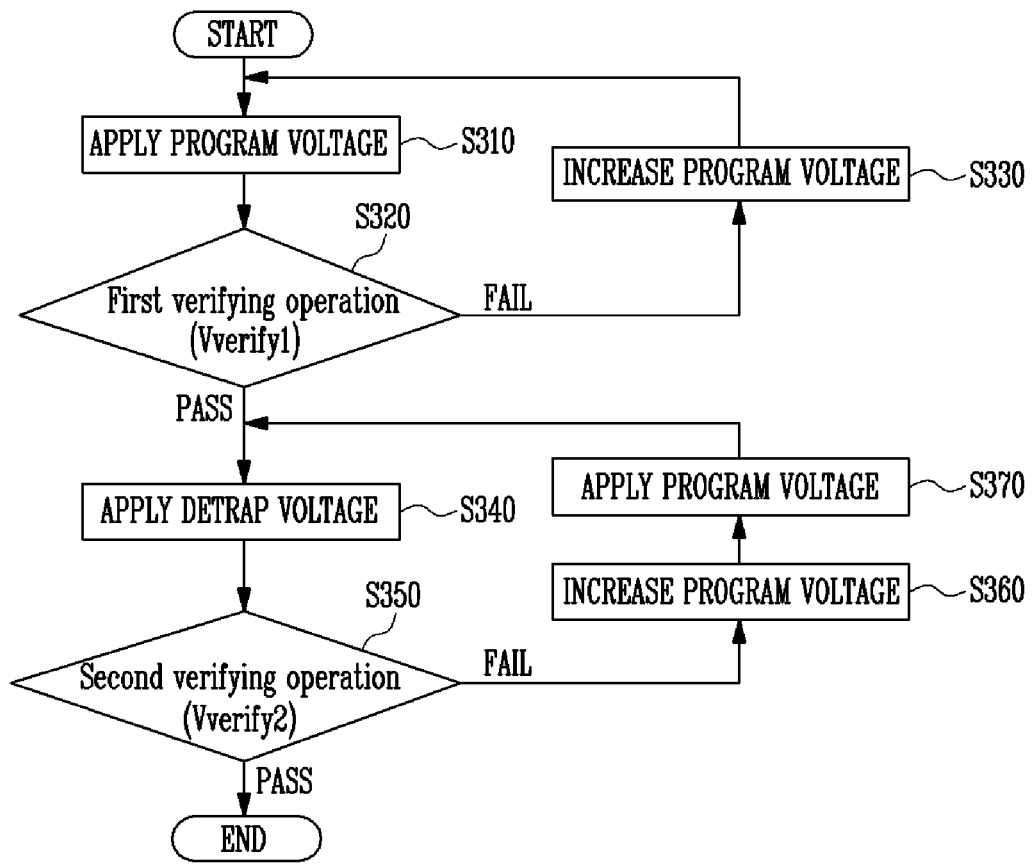
FIG. 4 is a flowchart representation of an embodiment of an operation of a semiconductor memory device.

FIG. 4 is a flowchart representation of an embodiment of an operation of a semiconductor memory device.

Figure 5:
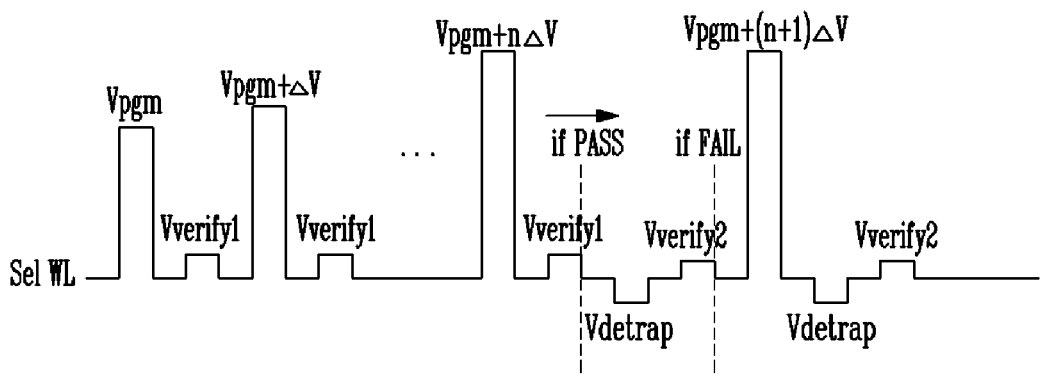
FIG. 5 is a graphical representation of an example of a waveform of a voltage applied to a selected word line during an embodiment of an operation of a semiconductor memory device.

FIG. 5 is a graphical representation of an example of a waveform of a voltage applied to a selected word line during an embodiment of an operation of a semiconductor memory device.

An embodiment of a method of operating the semiconductor memory will be described below with reference to FIGS. 1 to 5.

1) Program Voltage Applying Operation S310

When the control logic unit 140 receives a command CMD to perform a program operation of the semiconductor memory device, the control logic unit 140 may issue one or more commands to the read/write circuit 130 to temporarily store programming data DATA received from a device external to the semiconductor memory device in the plurality of page buffers PB1-PBm of the read/write circuit 130. During the program operation, each of the plurality of page buffers PB1-PBm may temporarily store the data DATA, and control the potentials of corresponding bit lines BL1-BLm in accordance with the according to the stored temporary data.

The voltage generation unit 150 may generate the program voltage Vpgm and the pass voltage Vpass under the control of the control logic unit 140. During the program voltage applying operation, the address decoder 120 may apply the program voltage Vpgm and the pass voltage Vpass to a selected word line Sel WL and other remaining word lines of the memory cell array 110, respectively, based on a decoded row address generated by decoding a row address. The row address is included in a received address ADDR.

2) First Verifying Operation S320

Following the performance of the program voltage applying operation S310, a first verifying operation S320 may be performed. The read/write circuit 130 may pre-charge the bit lines BL1-BLm to a predefined potential level. The voltage generation unit 150 may generate the first verifying voltage Vverify1 and the pass voltage Vpass under the control of the control logic unit 140. During the first verifying operation S320, the address decoder 120 may apply the first verifying voltage Vverify1 and the pass voltage Vpass to the selected word line Sel WL and other remaining word lines of the memory cell array 110, respectively. Then, the read/write circuit 130 may sense the potential level changes of the pre-charged bit lines BL1-BLm to perform the first verifying operation of the memory cells. It may be desirable for the first verifying voltage Vverify1 to have a relatively higher voltage level than a target threshold voltage for programming the memory cell. The first verifying operation may verify whether each of threshold voltages of the memory cells that have been programmed have a relatively higher voltage level than the target threshold voltage.

3) Program Voltage Increasing Operation S330

The first verifying operation S320 fails when the threshold voltages of some or all of the memory cells have a relatively lower voltage level than the first verifying voltage Vverify1. If the first verifying operation S320 fails, the control logic unit 140 may issue one or more commands to the voltage generation unit 150 to generate a new program voltage Vpgm+ΔV by increasing the program voltage Vpgm by a step voltage ΔV. The control logic unit 140 may issue one or more commands to the peripheral circuit unit to repeat the performance of the program voltage applying operation S310 using the new program voltage Vpgm+ΔV. The new program voltage is increased by the step voltage ΔV each time the program voltage applying operation S310 is performed. The new program voltage is gradually increased in the order of Vpgm+ΔV, . . . , Vpgm+nΔV, Vpgm+(n+1)ΔV.

4) Detrap Voltage Applying Operation S340

The first verifying operation S320 passes when the threshold voltages of all of the memory cells have a relatively higher voltage level than the first verifying voltage Vverify1. If first verifying operation S320 passes, the control logic unit 140 may issue one or more commands to the voltage generation unit 150 to generate a detrap voltage Vdetrap. The detrap voltage Vdetrap may have a negative (−) voltage value. The address decoder 120 may apply the detrap voltage Vdetrap to a selected word line Sel WL. Electrons trapped in a tunnel insulating film of a memory cell that is electrically coupled to the selected word line Sel WL may be detrapped by the detrap voltage Vdetrap. Accordingly, a threshold voltage of the memory cell electrically coupled to the selected word line may have a relatively lower voltage level than the first verifying voltage Vverify1.

5) Second Verifying Operation S350

After the detrap voltage applying operation S340 is performed, a second verifying operation S350 may be performed. The read/write circuit 130 may precharge the bit lines BL1-BLm to a predefined potential level. The voltage generation unit 150 may generate a second verifying voltage Vverify2 having a relatively lower voltage level than the first verifying voltage Vverify1 and a pass voltage Vpass under the control of the control logic unit 140. During the second verifying operation S350, the address decoder 120 may apply the second verifying voltage Vverify2 and the pass voltage Vpass to a selected word line Sel WL and the other remaining word lines, respectively. The read/write circuit 130 may then sense the potential level changes of the pre-charged bit lines BL1-BLm to perform the second verifying operation S350 of the memory cells. It may be desirable for the second verifying voltage Vverify2 to have the substantially the same potential level as a target threshold voltage for programming the memory cell.

The second verifying operation S350 passes when the threshold voltages of all of the memory cells have a relatively higher voltage level than the second verifying voltage Vverify2. The program operation ends when the second verifying operation S350 passes.

6) Program Voltage Increasing Operation S360

If the second verifying operation S350 fails as a result of the threshold voltage levels of some or all of the memory cells being relatively lower than the second verifying voltage Vverify2, the control logic unit 140 may issue one or more commands to the voltage generation unit 150 to generate a new program voltage. The new program voltage may be generated (for example, Vpgm+(n+1)ΔV) by increasing by the step voltage ΔV.

7) Program Voltage Applying Operation S370

After the program voltage increasing operation S360 is performed, the control logic unit 140 may apply the new program voltage Vpgm+(n+1)ΔV and the pass voltage Vpass to a selected word line Sel WL and the non-selected word lines, and then go back to the detrap voltage applying operation S340.

In an embodiment, after the first verifying operation S320 is performed, the detrap voltage applying operation S340 may be performed based on the result of the first verifying operation S320. Accordingly, a time for the program operation may be reduced by decreasing the number of applications of the detrap voltage Vdetrap. The retention characteristics of the memory cells may be improved by applying the detrap voltage Vdetrap and then removing the electrons trapped in a tunnel insulating film of the memory cell.

Figure 6:
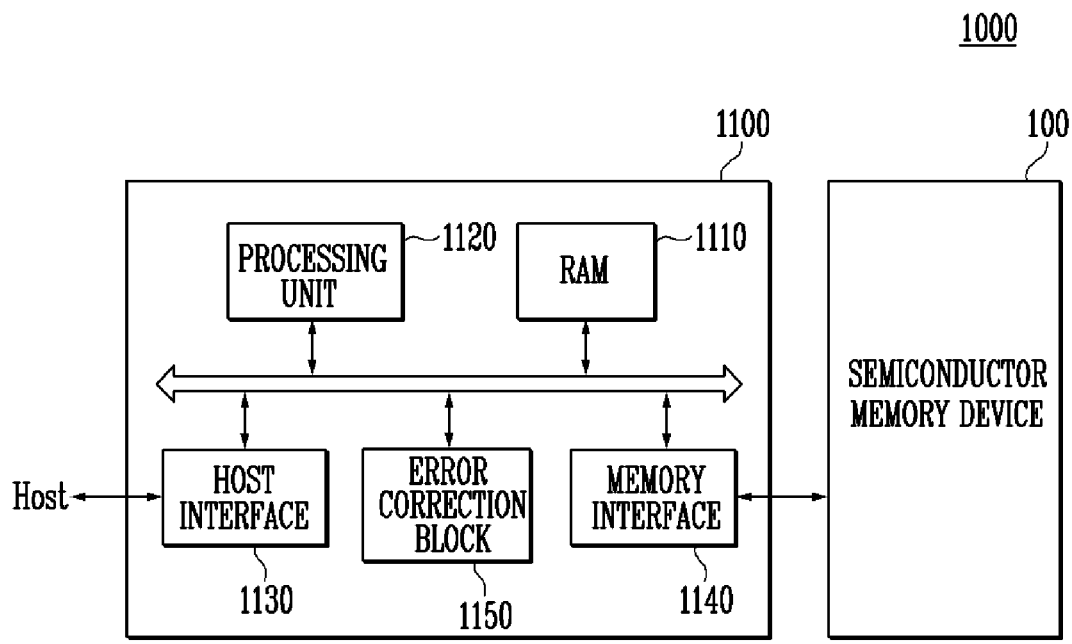
FIG. 6 is a block diagram representation of a memory system including an embodiment of the semiconductor memory device shown in FIG. 1.

FIG. 6 is a block diagram representation of a memory system 1000 including an embodiment of the semiconductor memory device 100 shown in FIG. 1.

The memory system 1000 may include a semiconductor memory device 100 and a controller 1100.

The semiconductor memory device 100 may be configured to operate as described with reference to FIG. 1.

The controller 1100 may be electrically coupled to a host HOST and to the semiconductor memory device 100. In response to a request from the host, the controller 1100 may be configured to access the semiconductor memory device 100. For example, the controller 1100 may be configured to manage the read, write, erase, and background operations of the semiconductor memory device 100. The controller 1100 may be configured to provide an interface between the semiconductor memory device 100 and the host. The controller 1100 may be configured to drive firmware for controlling one or more operations of the semiconductor memory device 100.

The controller 1100 may include a random access memory (RAM) 1110, a processing unit 1120, a host interface unit 1130, a memory interface unit 1140, and an error correcting unit 1150. The RAM 1110 may be used as at least one of an operating memory of the processing unit 1120, a cache memory between the semiconductor memory device 100 and the host, and a buffer memory between the semiconductor memory device 100 and the host. The processing unit 1120 may control various operations of the controller 1100. The controller 1100 may temporarily store program data provided by the host during a write operation.

The host interface unit 1130 may include a protocol for supporting data communication operations between the host and the controller 1100. In an embodiment, the controller 1200 may communicate with the host using at least one protocol selected from a Universal Serial Bus (USB) protocol, a MultiMediaCard (MMC) protocol, a Peripheral Component Interconnect (PCI) protocol, a PCI-Express protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, and an Integrated Drive Electronics (IDE) protocol, a private protocol.

The memory interface unit 1140 may provide an interface with the semiconductor memory device 100. For example, the memory interface unit 1140 may include a NAND interface or a NOR interface.

The error correcting unit 1150 may be configured to detect an error associated with data received from the semiconductor memory device 100 using an error correcting code (ECC), and may correct the detected error. The processing unit 1120 may adjust a read voltage according to an error detection result generated by the error correcting unit 1150, and issue one or more commands to the semiconductor memory device 100 to perform the read operation again. In an embodiment, the error correcting unit 1150 may be a component of the controller 1100.

The controller 1100 and the semiconductor memory device 100 may be integrated into a single semiconductor device. In an embodiment, the controller 1100 and the semiconductor memory device 100 may be configured as a memory card by being integrated into a single semiconductor device. For example, the controller 1100 and the semiconductor memory device 100 may be configured as a memory card such as a Personal Computer Memory Card International Association (PCMCIA) Card, a CompactFlash (CF) card, a SmartMedia (SM) card (SMC), a Memory Stick, an MMC, a reduced sized MMC (RS-MMC), a micro sized MMC (MMCmicro), a Secure Digital (SD) card, a mini SD (miniSD) card, a micro SD (microSD) card, an SD high capacity (SDHC) card, and a Universal Flash Storage (UFS) device by being integrated into a single semiconductor device.

The controller 1100 and the semiconductor memory device 100 may be configured as a solid state drive (SSD) by being integrated into a single semiconductor device. The SSD may include a storage device configured to store data in the semiconductor memory device. When the memory system 1000 is used as the SSD, an operating speed of the host electrically coupled to the memory system 2000 may be improved.

In an embodiment, the memory system 1000 may be one of a number of different components of an electronic device such as for example a computer, an ultra mobile personal computer (UMPC), a workstation, a net-book, a personal digital assistant (PDA), a portable computer, a web tablet, a wireless phone, a mobile player, a portable game console, a navigation device, a black box, a digital camera, a three-dimensional television, a digital audio recorder, a digital audio player, a digital picture recorder, a digital picture player, a digital video recorder, a digital video player, a device for wirelessly transmitting and receiving information. the memory system 1000 may be a component of one of a number of different electronic devices for configuring a home network, electronic devices for configuring a computer network, for configuring a telematics network, a radio frequency identification (RFID) device, or for configuring a computing system.

In an embodiment, the memory device 100 or the memory system 1000 may be packaged using one or a number of different types of packages. The semiconductor memory device 100 or the memory system 1000 may, for example, be packaged and mounted using a package on package (PoP), a ball grid array (BGA), a chip scale package (CSP), a plastic leaded chip carrier (PLCC), a plastic dual in line package (PDIP), a die in waffle pack, a die in wafer form, a chip on board (COB), a ceramic dual in line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi chip package (MCP), a wafer-level fabricated package (WFP), and a wafer-level processed stack package (WSP).

Figure 7:
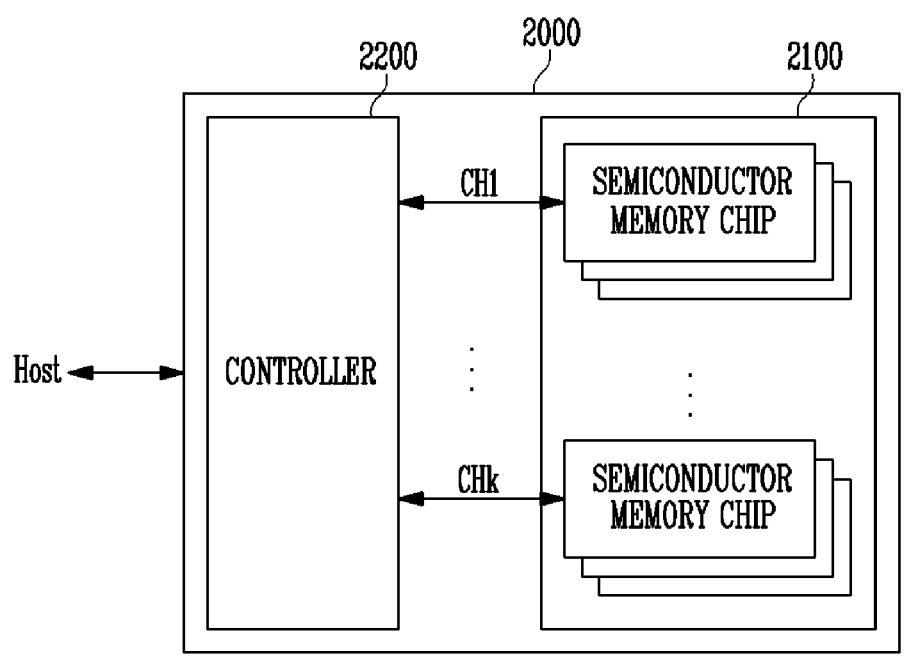
FIG. 7 is a block diagram representation of an example of an application of the memory system shown in FIG. 6.

FIG. 7 is a block diagram representation of an application of an example of the memory system shown in FIG. 6.

The memory system 2000 may include a semiconductor memory device 2100 and a controller 2200. The semiconductor memory device 2100 may include a plurality of semiconductor memory chips. The plurality of semiconductor memory chips may be divided into a plurality of groups.

The plurality of groups may communicate with the controller 2200 through each of first to k$^{th}$ channels CH1-CHk. Each of the semiconductor memory chips may have substantially the same construction and operation in substantially the same manner as the semiconductor memory device 100 described with reference to FIG. 1.

Each of the plurality of groups may be configured to communicate with the controller 2200 via a single common channel. The controller 2200 may be configured to have substantially the same construction as the controller 1100 described with reference to FIG. 6, and control the operation of the plurality of memory chips of the semiconductor memory device 2100 through the plurality of channels CH1-CHk.

Figure 8:
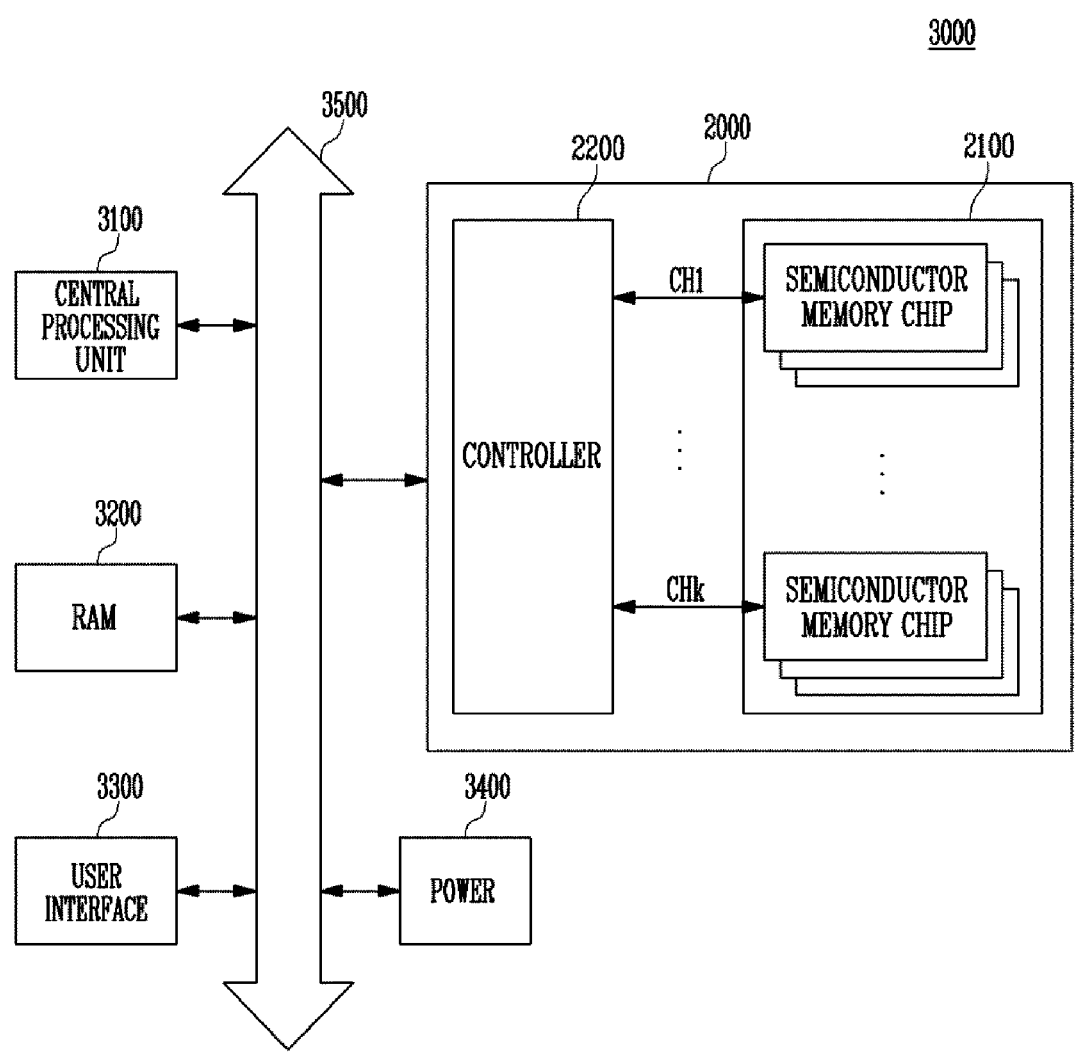
FIG. 8 is a block diagram representation of a computing system including the memory system described with reference to FIG. 7.

FIG. 8 is a block diagram representation of a computing system 3000 including the memory system described with reference to FIG. 7.

The computing system 3000 may include a central processing unit 3100, a RAM 3200, a user interface unit 3300, a power supply unit 3400, a system bus 3500, and a memory system 2000.

The memory system 2000 may be electrically coupled to the central processing unit 3100, the RAM 3200, the user interface unit 3300, and the power supply unit 3400 through the system bus 3500. Data provided via the user interface unit 3300 or processed by the central processing unit 3100 may be stored in the memory system 2000.

The semiconductor memory device 2100 is shown as being electrically coupled to the system bus 3500 via the controller 2200. The semiconductor memory device 2100 may be electrically coupled to the system bus 3500 directly. In this case, the function of the controller 2200 may be performed by the central processing unit 3100 and the RAM 3200.

In FIG. 8, the memory system 2000 described with reference to FIG. 7 has been used in the computing system 3000. The memory system 2000 may be replaced by the memory system 1000 described with reference to FIG. 6. In an embodiment, the computing system 300 may be configured to include both of the memory systems 1000, 2000 described with reference to FIGS. 6 and 7.

In various embodiments, during the performance of the program operation of the semiconductor memory device, the detrap voltage is applied to the selected memory cell based on a result of a verification operation. The retention characteristics of the memory cells may be improved, the number of times that the detrap voltage is applied may be reduced, and an operating time may be reduced.

While certain embodiments have been described above, it will be understood to those skilled in the art that the embodiments described are by way of example only. Accordingly, the semiconductor memory devices and methods of operating the semiconductor memory devices described herein should not be limited based on the described embodiments. Rather, the semiconductor memory devices and the methods of operating the semiconductor memory devices described herein should only be limited in light of the claims that follow when taken in conjunction with the above description and accompanying drawings.

What is claimed is:

1. A semiconductor memory device, comprising:
   a memory cell array including a plurality of memory cells;
   a peripheral circuit unit configured to perform a program voltage applying operation, a first verifying operation, and a detrap voltage applying operation with respect to the plurality of memory cells; and
   a control logic unit configured to issue at least one command to the peripheral circuit unit to determine whether to perform the detrap voltage applying operation based on a result of the first verifying operation performed following the performance of the program voltage applying operation,
   wherein the first verifying operation uses a first verifying voltage, wherein the first verifying voltage has a relatively higher voltage level than a target threshold voltage associated with programming the plurality of memory cells.

2. The semiconductor memory device of claim 1, wherein the control logic unit issues at least one command to the peripheral circuit unit to perform a second verifying operation following the performance of the detrap voltage applying operation.

3. The semiconductor memory device of claim 1, wherein the plurality of memory cells comprise charge trap device-based non-volatile memory cells.

4. The semiconductor memory device of claim 2, wherein the second verifying operation uses a second verifying voltage, wherein the first verifying voltage has a relatively higher voltage level than the second verifying voltage.

5. The semiconductor memory device of claim 4, wherein the second verifying voltage has substantially the same voltage level as the target threshold voltage.

6. The semiconductor memory device of claim 1, wherein, if the first verifying operation fails, the control logic unit issues at least one command to the peripheral circuit unit to repeat the operations beginning with the program voltage applying operation using a new program voltage generated by increasing a previously applied program voltage by a step voltage.

7. The semiconductor memory device of claim 1, wherein, if the first verifying operation passes, the control logic unit issues at least one command to the peripheral circuit unit to perform the detrap voltage applying operation.

8. The semiconductor memory device of claim 2, wherein, if the second verifying operation passes, the control logic unit ends the program operation.

9. The semiconductor memory device of claim 2, wherein, if the second verifying operation fails, the control logic unit issues at least one command to the peripheral circuit unit to repeat the performance of the operations beginning with the detrap voltage applying operation following the performance of the program voltage applying operation using a new program voltage generated by increasing a previously applied program voltage by a step voltage.

10. The semiconductor memory device of claim 1, wherein the detrap voltage applying operation applies a negative detrap voltage to a selected memory cell.

11. A semiconductor memory device, comprising:
    a memory cell array including a plurality of memory cells;
    a peripheral circuit unit configured to perform a program voltage applying operation, a first verifying operation using a first verifying voltage, a second verifying operation using a second verifying voltage, and a detrap voltage applying operation with respect to the plurality of memory cells; and a control logic unit configured to issue at least one command to the peripheral circuit unit to perform the program voltage applying operation, the first and second verifying operations, and the detrap voltage applying operation, and to sequentially perform the detrap voltage applying operation and the second verifying operation when the first verifying operation passes, wherein the first verifying voltage has a relatively higher voltage level than the second verifying voltage.

12. The semiconductor memory device of claim 11, wherein the plurality of memory cells comprise charge trap device-based non-volatile memory cells.

13. The semiconductor memory device of claim 11, wherein, if the first verifying operation fails, the control logic unit issues at least one command to the peripheral circuit unit to perform the operations beginning with the program voltage applying operation again using a new program voltage generated by increasing a previously applied program voltage by a step voltage.

14. The semiconductor memory device of claim 11, wherein, if the second verifying operation fails, the control logic unit issues at least one command to the peripheral circuit unit to perform the operations beginning with the detrap voltage applying operation again following the performance of the program voltage applying operation using a new program voltage generated by increasing a previously applied program voltage by a step voltage.

15. A method of operating a semiconductor memory device, comprising:

applying a program voltage to selected memory cells selected from among a plurality of memory cells;

performing a first verifying operation using a first verifying voltage;

applying a detrap voltage to the selected memory cells if the first verifying operation passes; and performing a second verifying operation using a second verifying voltage having a relatively lower voltage level than the first verifying voltage.

16. The method of claim 15, further comprising, if the first verifying operation passes, performing the operations beginning with the application of a new program voltage generated by increasing the previously applied program voltage by a step voltage.

17. The method of claim 15, wherein the applying of the detrap voltage includes applying a negative detrap voltage to the selected memory cells.

18. The method of claim 15, further comprising, if the second verifying operation fails, performing the operations beginning with the applying of the detrap voltage again following the application of a new program voltage generated by increasing the previously applied program voltage by a step voltage.

19. The method of claim 15, wherein the second verifying voltage has substantially the same voltage level as a target threshold voltage associated with programming the selected memory cells.

* * * * *